Feb. 27, 1962

H. A. WAGNER 3,023,346

RECTIFIER STRUCTURE

Filed Nov. 27, 1959

INVENTOR.
HOWARD A. WAGNER
BY
Frederick Shapoe
ATTORNEY

United States Patent Office 3,023,346

Patented Feb. 27, 1962

3,023,346

RECTIFIER STRUCTURE

Howard A. Wagner, Irwin, Pa., assignor to Westinghouse Electric Corporation, East Pittsburgh, Pa., a corporation of Pennsylvania Filed Nov. 27, 1959, Ser. No. 855,655
2 Claims. (Cl. 317—234)

This invention relates to rectifiers and in particular it is concerned with the provision of a semiconductor rectifier structure that can be produced economically.

In the manufacture of rectifiers heretofore, it has been conventional to assemble two semiconductor diodes or rectifiers on a common plate and use a center tapped transformer connection to obtain full wave rectification. With positive base diodes, the plate functions as the positive terminal. Leads to each of the other sides of the diodes are then connected to the transformer secondary winding and a center tap of this winding functions as the negative terminal for the rectifier output.

Such a construction is obviously quite simple; it has met with considerable interest for that reason as well as its minimization of wiring. Nevertheless, a rectifier structure as just stated has certain disadvantages. Encapsulated diodes must be used for protection from the influence of varying pressure, contaminants that may be in the atmosphere, and the like. To improve heat transfer characteristics of such structures, it is common to set each diode in a collar that is brazed to the plate. Moreover, the connection of the leads to the two diodes constitutes still another problem in which highly skilled labor is needed.

It is therefore a primary object of the present invention to provide a rectifier structure that is easily assembled, that can be made with inexpensive semiconductor diode components, that requires a minimum of highly skilled labor to construct, that is characterized by a minimum of wiring, and that has excellent heat transfer characteristics.

Figure 1:
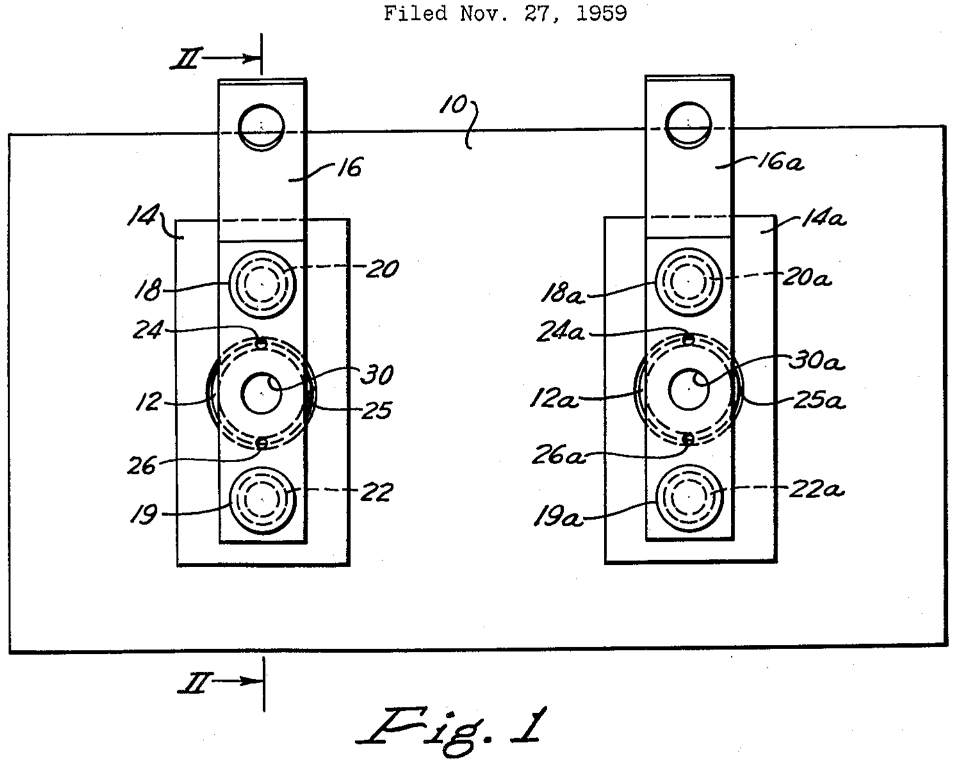
Figure 2:
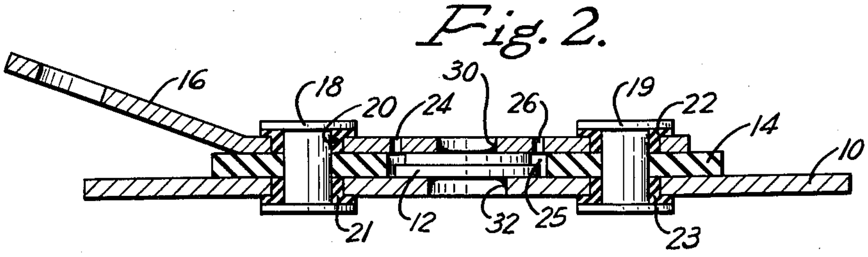
Figure 3:
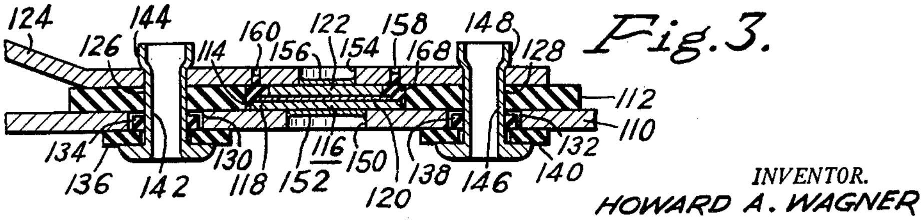

The invention will be readily understood upon considering the following discussion in conjunction with the attached drawing in which:

FIG. 1 shows a top plan view of a rectifier structure, for full wave rectification, in accordance with this invention; and FIG. 2 is a cross section taken along II—II of FIG. 1; and FIG. 3 is a modification thereof.

Referring now to the drawing, the numeral 10 indicates a plate member to which two diodes 12 and 12*a* are attached. While any heat and electrical conducting material can serve as the plate member, it is advantageous and preferred that it be made of a thin copper sheet or similar material having both good electrical and heat conducting characteristics. The diodes and associated equipment on this plate are duplicates and for that reason only one need be described in detail. However, the duplicate parts are indicated by the same numeral, modified by an "*a*" as the part actually described.

Spaced to one side of plate 10 is a wafer shaped diode 12 of the broad area, fused P-N junction type. The diodes are shown in elevation in FIG. 2. However, it should be apparent that one side, e.g., the bottom, is completely of P-type conductivity, and the other or opposite side is of N conductivity. Commercially available fused junction silicon diodes are preferred; suitable diodes are formed from a silicon wafer of one conductivity type to which has been fused a gold dot (or other electrode material) containing opposite conductivity type impurities. In such diodes, a bottom contact of the same conductivity type as the silicon is normally provided. As is usual, the top contact generally is smaller than the bottom contact, to maintain reasonable voltage ratings. The surface of both diodes 12 and 12*a* in contact with plate 10 must be of the same conductivity type, i.e., both P or both N. A layer or pad 14 of an insulation material, such as silicone impregnated glass fibers or other insulation capable of functioning at an elevated temperature, is placed on the plate 10 and surrounds the diode 12 about its sidewall. To receive the diode properly, the insulation is provided with a hole of slightly greater diameter than the diode.

Extending across the top of this structure is a relatively thin, long and narrow metal strap 16. The strap rests on the upper surface of the diode and is out of contact with plate 10. As is seen more clearly in FIG. 2, the end of strap 16 is bent upwardly away from plate 10 for ease of connecting a lead to the outside circuit (not shown). The resulting sandwich of materials is joined together by rivets 18 and 19 that are spaced from strap and plate 10 by insulating collars 20, 21, 22 and 23 which can also be made of silicone impregnated glass fibers or similar insulation. Actually, the insulating collars generally are omitted from either the plate side or the strap side, since they are needed only on one or the other. The metal strap 16 suitably is made of the same material as the plate 10, e.g., copper. Its width is substantially the diameter of the diode 12, while its length advantageously is sufficient to extend beyond the edge of the plate so that less chance for shorting the unit exists once the external lead is attached. Two small holes 24 and 26 are drilled through this strap to extend into the annular space 25 previously referred to between the diode sidewall and the insulation 14.

In manufacturing these structures, the sandwich as described is assembled. The diodes, straps and plate are pretinned where they touch. The solder used is a soft solder, e.g., tin-silver melting at about 265° F. The parts are then riveted together. The entire structure finally is heated to solder the diodes to the strap 16 and plate 10 to insure good ohmic contacts. Small holes 30 and 32 in the strap and plate respectively, facilitate a good solder joint. These holes permit visual inspection of the flow of solder and can be used as a place to add flux to facilitate wetting of the diode contacts and the edges of these holes. The resulting structure can then be used in the conventional manner, with the input leads to the unit being made to the ends of the metal straps rather than directly to the diodes. For example, a two diode structure as described can be used as a battery charger rectifier. A structure with but a single diode will provide half-wave rectification.

It can be observed that the structure itself largely provides protection for the diodes since the latter are substantially completely surrounded by the parts of the unit. However, in particular situations it may be desirable to further enclose these diodes. That can be conveniently accomplished by forcing a silicone resin, or like material such as silicone rubber or an epoxy resin, through holes 24 and 26 in the strap 16 until it covers the joined area of the silicon wafer and its upper junction forming contact or until it fills the annular space 25. When it starts to emerge at the sides of the strap, it is apparent that full coverage has been provided. This effectively excludes the atmosphere from the junction area.

In actual tests of a full wave rectifier of the type described, a thirty minute duty cycle of 20 minutes at 90 amps load and 10 minutes off was used. The test unit was operated for over 2700 hours without any evidence of failure. For comparative purposes, it was noted that one unit outlasted four sets of individually encapsulated diodes and was still operating entirely satisfactorily.

It will be observed that the diodes of the described structure are completely enclosed, being joined by solder to the metal strap and plate and being surrounded by the insulating silicone impregnated glass fibers. It is therefore apparent that the expensive encapsulated diodes with their hermetic seals and mounting collars used heretofore are unnecessary in practicing this invention. It will further be noted that the structure naturally provides good heat transfer characteristics, with the large plate and substantial straps drawing heat from the diodes and discharging it to the surrounding air. The thousands of cycles to which units were successfully subjected without encountering thermal fatigue are firm evidence of the heat discharge characteristics of the structure. The simplicity of assembling the structure as well as the ease of using it, i.e., joining it into an external circuit without delicate joining of leads to the diode surfaces, are other important advantages of the invention.

Referring to FIG. 3 of the drawing there is illustrated a modification of the device of FIGURES 1 and 2. On one face of a tinned copper plate 110 is placed a sheet 112 of insulating material such as a glass fiber-silicone laminate, with at least one aperture 114 in which is placed a semiconductor diode 116. The diode 116 may comprise, for example, a molybdenum (tungsten or tantalum may be employed in lieu of molybdenum) base electrode 118, a silicon wafer 120 and a molybdenum counterelectrode 122, brazed into the unit 116 with a silver base brazing alloy such as is disclosed in U.S. Patents 2,763,822 and 2,801,375. The diode 116 is a junction diode, though other similar semiconductor devices may be employed. The molybdenum base electrode 118 is in close electrical and thermal conducting contact with plate 110. At the upper face of diode 116, the counterelectrode 122 is in close electrical and thermal conducting contact with a narrow strap 124. Relatively small aligned apertures 126 and 128 are provided in the strap 124 and sheet 112 and are concentric with larger apertures 130 and 132 respectively, in the plate 110. In the apertures 130 and 132 are insulating collars 134 and 138 with an internal opening of a diameter of about that of aperture 126 or slightly larger. A large insulating washer 136 and 140 is placed below apertures 130 and 132, respectively. A hollow rivet 142 or other expandible rivet, passes through the washer 136, collar 134 and aperture 126 and the expanded top 144 holds the plate and strap assembly firmly. Similarly hollow rivet 146 having an expanded top 148 passing the assembly of washer 140, collar 138 and aperture 128, holds the plate and strap assembly firmly. It will be seen that the plate 110 is electrically insulated from strap 124.

An aperture 150 in plate 110 is aligned more or less, symmetrically with the molybdenum base electrode 118 and solder 152 provides for a good electrically conductive soldered joint therebetween. Likewise an opening 154 is provided in strap 124 in alignment with counterelectrode 122 and solder 156 therein enable good electrical conductivity therebetween. Small openings 158 and 160 enable silicone resin 168 to be introduced to fill any space between the walls of aperture 114 and diode 116 so as to seal the diode from the atmosphere. Any other insulating resin such as an epoxy resin or polytetrafluorethylene resin may be applied to the space.

In accordance with the provisions of the patent statutes, the present invention has been explained and there has been described what is now thought to be its best embodiment. However, it should be understood that the invention can be practiced otherwise than as specifically illustrated and described.

I claim as my invention:

1. A semiconductor device comprising a metal plate, a sheet of insulating material disposed on the metal plate and at least one metal strap disposed on the sheet of insulating material, the sheet of insulating material having an aperture, a semiconductor member having top and bottom electrodes disposed in the aperture so that the bottom electrode is in contact with the plate and the upper electrode is in contact with the strap, solder means joining the electrodes to the plate and strap respectively, an insulating resin filling the space between the walls of the aperture and the semiconductor member, and fastening means including electrical insulation for firmly connecting the strap, the sheet and the metal plate so as to hold the semiconductor member in place while maintaining the strap and plate insulated and spaced from each other except for the semiconductor member.

2. A semiconductor device comprising a metal plate, a sheet of insulating material disposed on the metal plate and at least one metal strap disposed on the sheet of insulating material, the sheet of insulating material having an aperture, a semiconductor member having top and bottom electrodes disposed in the aperture so that the bottom electrode is in contact with the plate and the upper electrode is in contact with the strap, solder means joining the electrodes to the plate and strap respectively, a small aperture being present in both the strap and the metal plate exposing a part of the top and bottom electrodes, solder disposed in each of the small apertures to bond the electrodes to the strap and plate respectively, an insulating resin filling the space between the walls of the aperture and the semiconductor member, and fastening means including electrical insulation for firmly connecting the strap, the sheet and the metal plate so as to hold the semiconductor member in place while maintaining the strap and plate insulated and spaced from each other except for the semiconductor member.

References Cited in the file of this patent

UNITED STATES PATENTS

| | | |
|---|---|---|
| 2,815,472 | Jackson et al. | Dec. 3, 1957 |
| 2,899,610 | Amstel | Aug. 11, 1959 |